(12) United States Patent
Hayles et al.

(10) Patent No.: US 6,376,839 B1
(45) Date of Patent: Apr. 23, 2002

(54) SEM FOR TRANSMISSION OPERATION WITH A LOCATION-SENSITIVE DETECTOR

(75) Inventors: Michael F. Hayles; Gerardus N. A. Van Veen, both of Eindhoven (NL)

(73) Assignee: Philips Electron Optics, Eindhoven (NL)

( * ) Notice: Subject to any disclaimer, the term of this patent is extended or adjusted under 35 U.S.C. 154(b) by 0 days.

(21) Appl. No.: 09/473,537

(22) Filed: Dec. 28, 1999

(30) Foreign Application Priority Data

Dec. 29, 1998 (EP) .............................................. 98204478

(51) Int. Cl.[7] .............................. G01N 23/00; G21K 7/00
(52) U.S. Cl. ....................................... 250/311; 250/397
(58) Field of Search ................................. 250/310, 311, 250/306, 397, 282, 305; 430/22, 296; 324/751; 378/86

(56) References Cited

U.S. PATENT DOCUMENTS 5,051,585 A * 9/1991 Koshishiba et al. ........ 250/306

FOREIGN PATENT DOCUMENTS

EP          0348992 A2    1/1990    ............ H01J/37/30

* cited by examiner

*Primary Examiner*—Jack Berman
*Assistant Examiner*—Johnnie L Smith, II

(57) ABSTRACT

The SEM according to the invention is arranged to detect scattered electrons transmitted by the specimen (22). The detector is constructed so as to have a flat detector surface (26) for a large angular range. In order to select a given angular range, a mask (24) with an eccentric opening (40) is arranged between the specimen and the detector surface and it is also arranged so as to be rotatable. An optimum angle relative to a given direction in the specimen can thus be selected for a given type of contrast. The mask is preferably displaceable in the specimen direction, the detector surface being subdivided into a plurality of parts (26a, 26b) and the assembly formed by the specimen and the detector surface is tiltable through an angle relative to the optical axis (4). A high degree of flexibility is thus achieved for the selection of the electrons to be detected which are scattered by the specimen, so that adjustments can be made so as to achieve an optimum contrast situation.

7 Claims, 4 Drawing Sheets

SEM FOR TRANSMISSION OPERATION WITH A LOCATION-SENSITIVE DETECTOR

FIELD OF THE INVENTION

The invention relates to a particle-optical apparatus which includes
- a particle source for producing a primary beam of electrically charged particles which travel along an optical axis of the apparatus under the influence of an acceleration voltage,
- a specimen holder with a specimen location for a specimen to be irradiated by the primary beam,
- a focusing device for producing a focus of the primary beam in the vicinity of the specimen location,
- a beam deflection system for scanning the specimen by means of the focused primary beam,
- detection means with a detector surface for detecting electrically charged particles originating from the specimen in response to the incidence of the primary beam, said detector surface being arranged behind the specimen location, viewed from the propagation direction of the primary beam,
- a mask for the electrically charged particles originating from the specimen, which mask is arranged between the detector surface and the specimen location.

DESCRIPTION OF PRIOR ART

A particle-optical apparatus of this kind is known from the published European patent application no. 0 348 992.

Apparatus for scanning a specimen by means of a focused beam of charged particles are known as scanning electron microscopes. Generally speaking, two types of scanning electron microscope are known. Both types include a focusing device for producing a focus of the primary beam in the vicinity of the specimen location, usually referred to as the objective.

The objective in the first type consists of a generally known magnetic gap lens in which the gap for forming the focusing magnetic field is formed by two oppositely situated cylindrical magnet poles. In this apparatus the specimen is arranged between the magnet poles of the objective. An apparatus of this kind is arranged to achieve a very small image of the electron source at the area of the specimen (the scan spot), enabling a very high resolution to be achieved for the image of the specimen. Such apparatus satisfies very severe requirements as regards stability, notably in respect of the mechanical as well as the electrical facilities, for example low sensitivity to vibrations of the specimen and stability of the accelerating voltage and the power supplies for the lenses. Moreover, such apparatus are arranged to produce the high accelerating voltages required for the high resolutions, which voltages amount to an order of magnitude of several hundreds of kV. Preparing the specimens so that they are suitable for analysis in such apparatus is a comparatively complex operation and the introduction of these specimens into the apparatus and the analysis therein is time-consuming. These apparatus, generally known as transmission electron microscopes (TEMs) are complex and expensive because of the severe resolution requirements.

In the second type of scanning electron microscope the objective may also consists of a generally known magnetic gap lens or a monopole lens, the specimen carrier and the wall of the specimen chamber then forming part of the magnetic circuit for the spot-forming magnetic field. In apparatus of this kind the specimen is arranged outside the mechanical boundary of the objective, so that comparatively large specimens can be examined and a high degree of mobility of the specimen can be achieved. The imaging in such apparatus is performed by the detection of electrons released from the specimen by the electrons in the primary beam. The detector for such released electrons is situated practically always at the top of the specimen, i.e. at the side where the primary beam is incident on the specimen. This means that in this manner only electrons released from the surface of the specimen are detected. In respect of their use these apparatus are considerably more flexible than said TEMs, constituting a significant advantage for the examination of large numbers of specimens, for example as necessary in the IC industry or more generally for the testing of materials. Apparatus of this kind, known as scanning electron microscopes (SEMs) generally may have a simpler construction; notably they are not arranged to operate with comparatively high acceleration voltages, their acceleration voltage being limited to the order of magnitude of 50 kV.

However, when SEMs are used it is often desirable to study regions which are situated deeper into the specimen. It does not suffice to detect electrons released from the surface of the specimen, but electrons have to be detected which originate from the volume of the specimen. This situation occurs also when information is to be extracted concerning individual layers in integrated circuits. To this end, the specimen is made to be so thin (for example, a thickness of between 60 nm and 400 nm), that electrons of an energy of the order of magnitude of some tens of keV can traverse the entire specimen. In that case the detector surface of the detector should be arranged underneath the specimen, so that electrons having the traversed the entire specimen can be detected.

In the apparatus which is known from the cited European patent application no. 0 348 992 the specimen to be examined is arranged outside the mechanical boundaries of the objective, so that the desired manipulability of the specimen is achieved. The detector surface is then situated underneath the specimen. This known apparatus is provided with a mask (referred to therein as "injection diaphragm" and shown in FIG. 7) for transmitting or blocking electrons emanating from the specimen, which mask is arranged between the detector surface and the specimen. However, the known apparatus is arranged to accelerate the primary beam with a voltage of the order of magnitude of 75 kV or more, so that this cannot be called a SEM in the terms commonly used by those skilled in the art.

SUMMARY OF THE INVENTION

It is an object of the invention to provide a SEM of the kind set forth in the preamble of claim 1, in which notably specimens can be studied as they occur in the IC industry, it being possible to select a desired contrast mechanism upon imaging of the specimen and it being possible to detect crystal defects in crystalline specimens.

To achieve this, the apparatus according to the invention is characterized in that
- the particle-optical apparatus is arranged to produce an acceleration voltage of no more than 50 kV,
- that the mask is provided with at least one mask opening which is provided so as to be eccentrically situated in the mask,
- that there are provided rotation means for rotating the mask during operation of the particle-optical apparatus.

The electrons transmitted by the specimen are scattered during transmission and hence leave the specimen at an angle other than zero relative to the direction of incidence. Because the mask is rotatable and provided with an eccentric opening, electrons from this dispersed beam can be selected from a given angular range. This angular range may concern an angle enclosed relative to the direction of incidence (by arranging the mask opening at a given distance from the optical axis), for an angle relative to a given direction in the specimen. Notably the latter possibility is important because it is thus possible to observe deviations which disturb the rotational symmetry of the specimen material. Rotation of the mask during the irradiation by means of the primary beam enables an angular distribution of the scattered electrons to be picked up.

The assembly formed by the specimen and the detector surface in an embodiment of the particle-optical apparatus according to the invention can be tilted through an angle relative to the optical axis, the detector surface being divided into at least two parts which can be electrically insulated from one another. These steps offer the additional advantage that the primary beam is not incident at right angles relative to the optical axis but at said angle. Because the detector surface is also tilted, it can be ensured that the non-deflected part of the beam is intercepted by one of the parts of the detector surface, and that the part of the beam which is deflected by the specimen is detected by another part of the detector surface. By subtracting the signals thus obtained from one another, information is acquired in conformity with the dark field observation method whereas information is acquired by way of the bright field observation method when the signals are added. Further angular selection, if any, can also be realized by means of the mask.

In another embodiment of the particle-optical apparatus according to the invention, the detector surface is displaceable in a direction parallel to the optical axis relative to the specimen location. By situating the detector surface nearer or further from the specimen, in combination with the selective effect of the mask a spatial selection of electrons transmitted by the specimen is also possible.

The mask opening in another embodiment yet of the particle-optical apparatus according to the invention has the appearance of at least one radial slit. Accurate angular selection (i.e. an angle relative to a given direction in the specimen) of the transmitted electrons can thus be performed. The accuracy of the selection can then be determined by the width of the slit.

The detector surface in another embodiment of the particle-optical apparatus according to the invention is subdivided into at least two mutually electrically insulatable parts, the mask being provided with at least two substantially diametrically situated mask openings. As a result of these steps, angular selection is possible in respect of scatter angle as well as in respect of an angle relative to a given direction in the specimen in combination, possibly also in combination with dark field or bright field observation.

In another embodiment yet of the particle-optical apparatus according to the invention the distance between the specimen and the detector surface is at the most 15 mm. This step is useful notably when use is made of an immersion lens because in that situation the specimen and the space therebelow are situated in the magnetic field of the lens. Consequently, the electrons transmitted by the specimen are subject to a given rotation which is dependent on the magnetic field strength and the distance traveled by the electrons underneath the specimen, which angular rotation obscures the information as regards the rotation of origin on the specimen. By keeping this distance small (while maintaining a given minimum distance in order to convert the scatter angle into a distance on the detector surface), the effect of such undesirable angular rotation is minimized.

BRIEF DESCRIPTION OF THE DRAWING the invention will be described in detail hereinafter with reference to the Figures, corresponding reference numerals denoting corresponding elements. Therein:

DETAILED DESCRIPTION OF THE PREFERRED EMBODIMENTS

Figure 1:
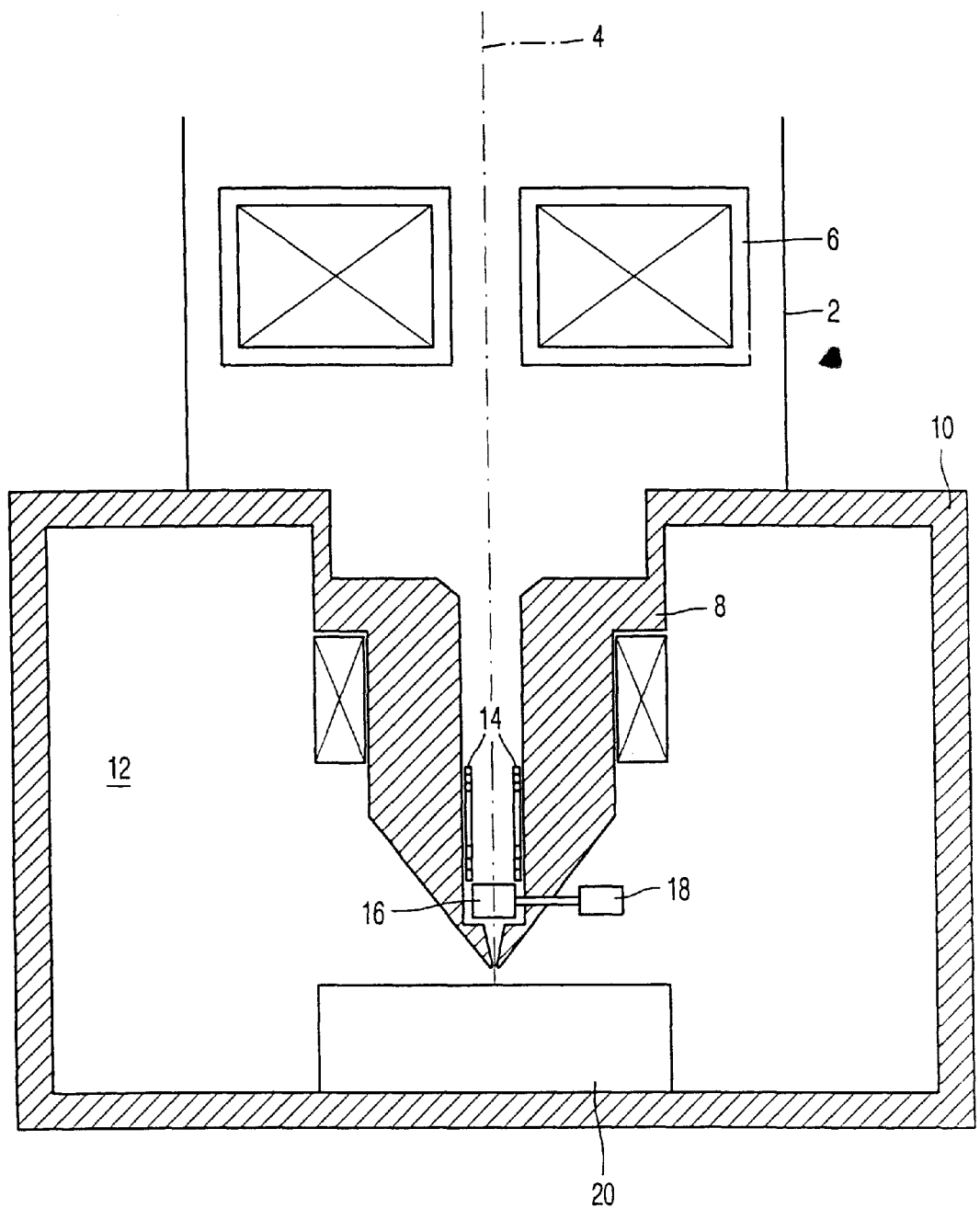
FIG. 1 shows diagrammatically a relevant part of a particle-optical instrument (a SEM) according to the invention.

FIG. 1 shows a relevant part of a SEM in which the invention can be carried out. The Figure shows a particle-optical instrument in the form of a part of a column 2 of a scanning electron microscope (SEM). As is customary, a beam of electrons (the primary beam) is produced in this instrument by an electron source (not shown in the Figure), which beam travels along the optical axis 4 of the instrument. This electron beam can traverse one or more electromagnetic lenses, such as the condenser lens 6, after which the electron beam ultimately reaches the objective lens 8. This lens, in this case being a so-called monopole lens, forms part of a magnetic circuit which is also formed by the wall 10 of the specimen chamber 12. The objective lens 8 is used to form a focus by means of the primary electron beam, the specimen arranged underneath the objective lens being scanned by means of said focus. The scanning of the specimen is realized by moving the electron beam across the specimen in two mutually perpendicular directions while utilizing scan coils 14 which are accommodated in the bore of the objective lens 8. The specimen is arranged in a specimen holder which forms part of a specimen carrier 20 yet to be described. The specimen holder can perform a displacement in two mutually perpendicular directions so that a desired region of the specimen can be selected for examination. The objective 8 thus serves as a focusing device for producing a focus of the primary beam in the vicinity of the specimen on the specimen carrier 20.

In the transmission mode the imaging in this microscope takes place in that electrons from the primary beam traverse the specimen and emanate from the lower side thereof, after which they are detected by a detector. It is also possible to operate the microscope in the conventional mode in which secondary electrons are released from the specimen and move back in the direction of the lens 8. These secondary electrons are detected by a detector 16 arranged in the bore of this lens. A processing unit for energizing the detector and for converting the stream of detected electrons into a signal that is suitable for forming an image of the specimen, for example by means of a cathode ray tube, is connected to the detector.

Figure 2:
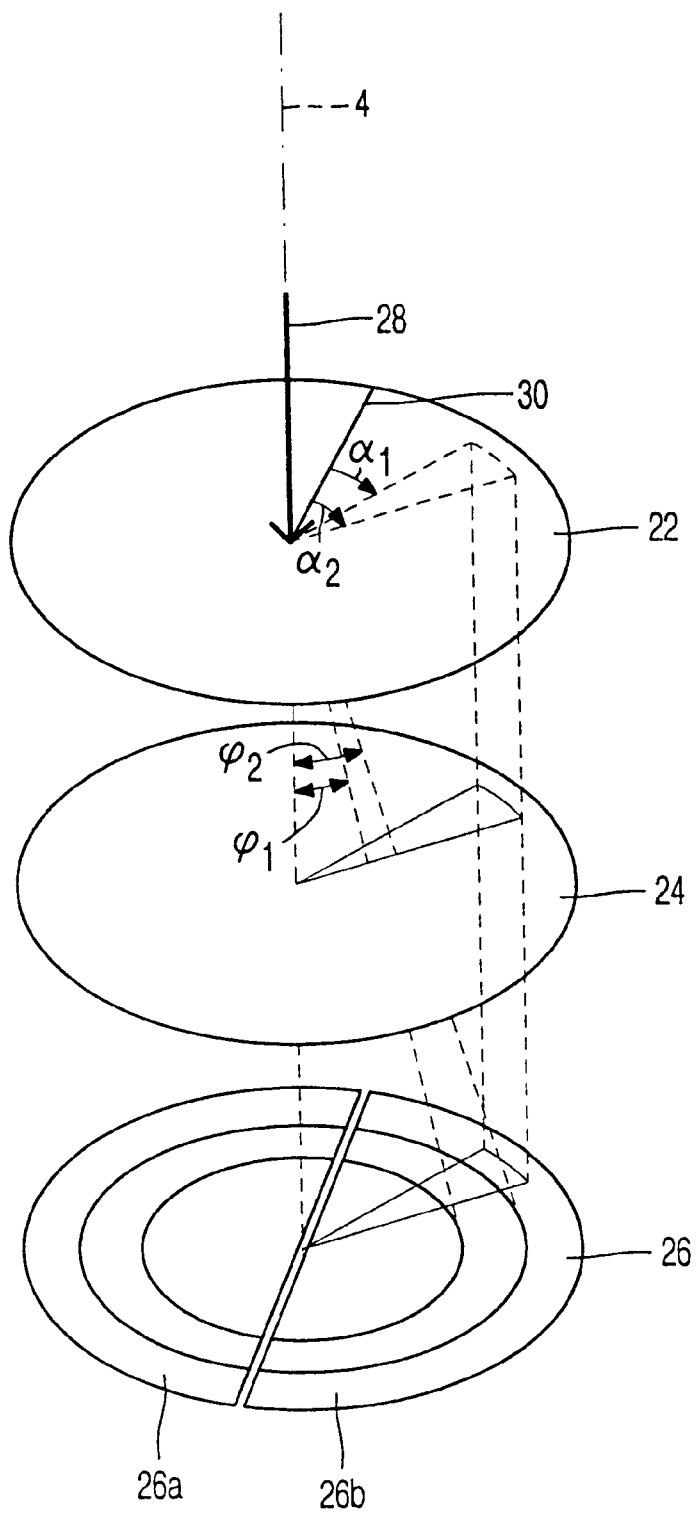
FIG. 2 shows diagrammatically the transmission and selection of the electrons transmitted by the specimen.

FIG. 2 illustrates the process of transmission and selection of the electrons transmitted by the specimen. Shown below one another are the specimen 22 to be examined in the SEM, the mask 24 and the detector surface 26. In this Figure the detector surface is subdivided into two equal halves 26a and 26b which are electrically insulated from one another. The mask 24 in the present Figure is provided with a mask opening which is eccentrically situated in the mask 24. The projection of this mask opening is denoted by dashed lines on the specimen and on the detector surface.

Figure 3A:
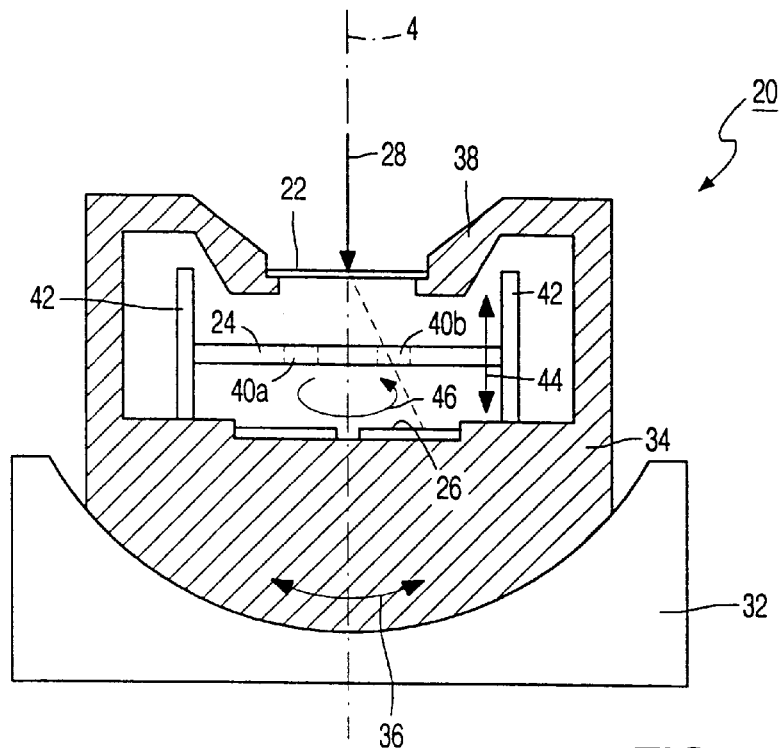
FIGS. 3a and 3b show the specimen holder according to the invention in two different positions.
Figure 3B:
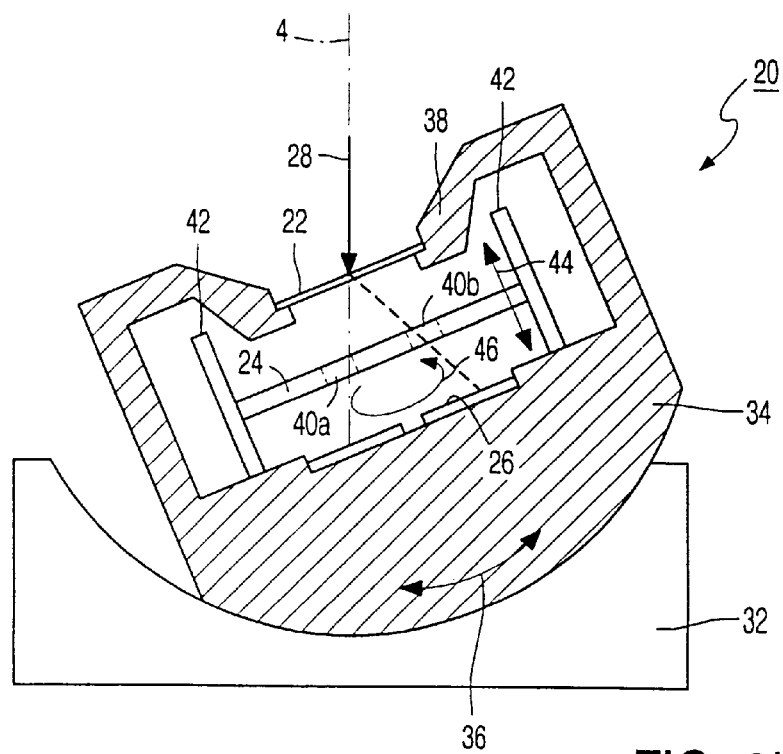

The primary beam 28, focused by the objective, is incident on the specimen 22. The electrons in this beam are scattered in the specimen 22, so that they emanate from the specimen at different angles φ relative to the non-deflected primary beam; the Figure shows two angles $\phi_1$ and $\phi_2$. It will be evident from this Figure that, using the mask opening shown, all angles φ lying within the range of the detector surface are transmitted and that the sector-like opening in the mask transmits only the scattered electrons which enclose an angle, relative to a fixed direction 30 in the specimen, which lies between the values $\alpha_1$ and $\alpha_2$.

the FIGS. 3a and 3b show the specimen carrier 20 according to the invention in two different positions. The specimen carrier shown in these Figures has a facility for tilting the assembly formed by the specimen 22 and the detector 26 through an angle, relative to the optical axis, about a center which is situated within the specimen; this offers the advantage that the angle of incidence of the primary beam 28 on the specimen surface can be modified during the observation, without the observed region of the specimen thus being shifted. the possibility of tilting is symbolically represented by the arrow 36 and by the fact that the movable body 34 spherically adjoins the fixed portion 32 of the specimen carrier 20.

The specimen 22 is situated in a recess in the specimen holder 38. Underneath the specimen holder there is arranged a mask 24 for selectively transmitting electrons scattered by the specimen. To this end, the mask is provided with mask openings such as the openings 40a and 40b which are in this case diametrically situated relative to the center of the mask. The detector surface 26 is arranged below the mask 24. This surface forms part of a semiconductor detector which is connected to an electronic circuit (not shown in the Figure) for the further processing of the signals produced by the detector.

The mask is displaceable in a direction perpendicular to the detector surface, so that it can be arranged nearer to or further from the specimen. This possibility is symbolically indicated by way of an arrow 44 and a mask holder 42 whereby the mask can be moved to and fro, if desired by means of a drive (not shown). The mask is also rotatable about an axis which extends perpendicularly to the detector surface, so that the correct position of the mask opening (openings) relative to the detector surface can be selected (if desired, by means of a drive which is not shown). This possibility is symbolically indicated by way of an arrow 46.

The primary beam 28 is incident perpendicularly to the specimen surface in FIG. 3a. The non-deflected part of the primary beam is intercepted by the mask whereas a part of the electrons scattered in the specimen is transmitted via the two mask openings 40a and 40b. When these mask openings are not arranged at the same distance from the center of the mask, two different parts of the scatter angle can be selected for detection.

In FIG. 3b the primary beam 28 is obliquely incident on the specimen surface. The non-deflected part of the primary beam can be intercepted again by the mask, but it is also possible to transmit said part via one of the mask openings 40a. A part of the electrons scattered in the specimen is transmitted by the other mask opening 40b.

The detector surface in this embodiment is subdivided into two semicircular parts, so that the electrons traversing one mask opening can be electrically separated from the electrons traversing the other mask opening, thus enabling separate processing or a desired combination of both signals.

Figure 4:
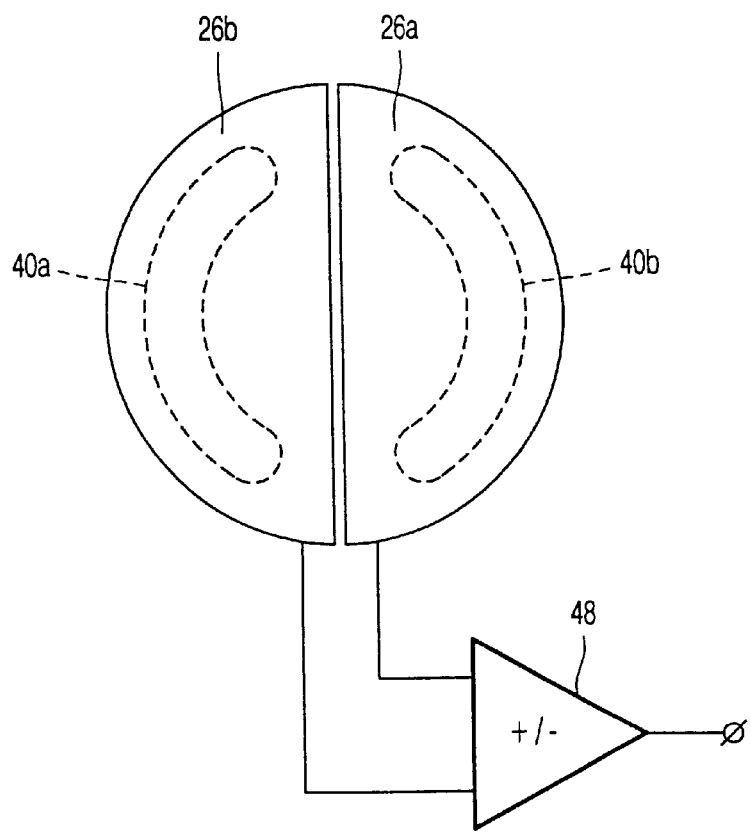
FIG. 4 is a diagrammatic representation of the detector surface in combination with the mask openings.

FIG. 4 is a diagrammatic representation of the detector surface in combination with the mask openings 40a and 40b situated thereabove. In this case the openings are both shaped as arcs of circle so that an as high as possible yield of detected electrons is possible upon selection of a given deflection angle φ (see FIG. 2). Because of the subdivision of the detector surface into two equal, mutually insulated parts 26a and 26b, the signals can be added or subtracted. This is possible by connecting each of the parts to a separate input of a summing or differential amplifier 48. A bright field observation of the specimen is realized by forming the sum of the two signals whereas a dark field observation is obtained by forming the difference.

Figure 5:
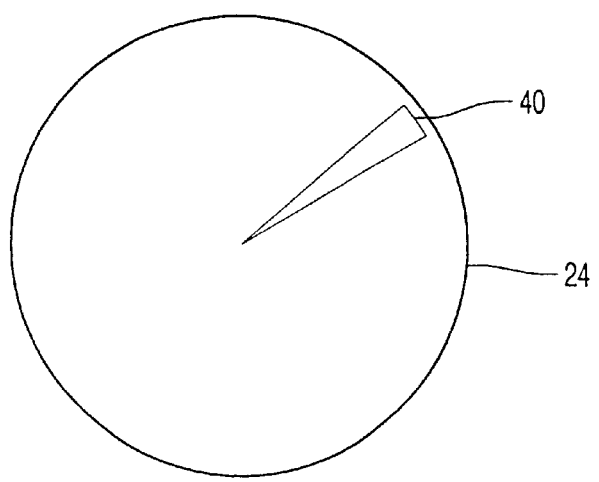
FIG. 5 illustrates a feasible eccentric mask opening.

Evidently, the mask openings may also have a different appearance; for example, FIG. 5 shows a mask opening which is particularly suitable for the selection of electrons which are tangentially deflected at a given angle a relative to a fixed direction in the specimen. Other appearances are also feasible, notably combinations of the described shapes so that selection can be performed in respect of a given radial deflection angle as well as a given tangential deflection angle.

What is claimed is:

1. A particle-optical apparatus which includes
    a particle source for producing a primary beam (28) of charged particles which travel along an optical axis (4) of the apparatus under the influence of an acceleration voltage,
    a specimen carrier (20) with a specimen location (38) for receiving a specimen (22) to be irradiated by the primary beam,
    a focusing device (8) for forming a focus of the primary beam in the vicinity of the specimen location,
    a beam deflection system (14) for scanning the specimen by means of the focused primary beam,
    detection means having a detector surface (26) for detecting electrically charged particles emanating from the specimen in response to the incidence of the primary beam, said detector surface being arranged behind the specimen location, looking in the direction of propagation of the primary beam,
    a mask (24) for the electrically charged particles emanating from the specimen, which mask is arranged between the detector surface and the specimen location, characterized in that the particle-optical apparatus is arranged to produce an acceleration voltage of at the most 50 kV, the mask (24) is provided with at least one mask opening (40) which is eccentrically situated in the mask, and there are provided rotation means for rotating the mask during operation of the particle-optical apparatus.

2. A particle-optical apparatus as claimed in claim 1, in which the assembly formed by the specimen (22) and the detector surface (26) is arranged so as to be tiltable through an angle relative to the optical axis (4), the detector surface being subdivided into at least two parts (26a, 26b) which can be electrically insulated from one another.

3. A particle-optical apparatus as claimed in claim 1, in which the detector surface (26) is arranged so as to be displaceable relative to the specimen location (38) in a direction perpendicular to the plane of the detector surface.

4. A particle-optical apparatus as claimed in claim 1, in which the mask opening (40) has the appearance of at least one radial slit.

5. A particle-optical apparatus as claimed in claim 1, in which the detector surface (26) is subdivided into at least two parts (26a, 26b) that can be electrically insulated from one another, the mask (24) being provided with at least two mask openings (40a, 40b) which are substantially diametrically situated relative to one another.

6. A particle-optical apparatus as claimed in claim 1, in which the distance between the specimen and the detector surface amounts to no more than 15 mm.

7. A specimen carrier provided with a mask, rotation means for rotating the mask during operation of the particle-optical apparatus, and a detector surface as defined in claim 2.

* * * * *